US012796216B2

(12) United States Patent
Hu et al.

(10) Patent No.: US 12,796,216 B2
(45) Date of Patent: Nov. 10, 2026

(54) LIGHT EMITTING ELEMENT

(71) Applicant: TAIZHOU GUANYU TECHNOLOGY CO., LTD., Zhejiang Province (CN)

(72) Inventors: Gengshuo Hu, Zhejiang Province (CN); Yu-Lung Chang, Tainan City (TW); Huei-Siou Chen, Taipei City (TW); Kuo-Cheng Hsu, Taichung City (TW)

(73) Assignee: TAIZHOU GUANYU TECHNOLOGY CO., LTD., Zhejiang Province (CN)

( * ) Notice: Subject to any disclaimer, the term of this patent is extended or adjusted under 35 U.S.C. 154(b) by 345 days.

(21) Appl. No.: 18/588,019

(22) Filed: Feb. 27, 2024

(65) Prior Publication Data

US 2024/0389380 A1 Nov. 21, 2024

(30) Foreign Application Priority Data

May 16, 2023 (CN) ........................ 202310566059.6

(51) Int. Cl.

| | |
|---|---|
| ***H10K 50/86*** | (2023.01) |
| ***H10K 59/80*** | (2023.01) |
| *H10K 102/00* | (2023.01) |

(52) U.S. Cl.
CPC ....... *H10K 50/865* (2023.02); *H10K 59/8792* (2023.02); *H10K 2102/351* (2023.02)

(58) Field of Classification Search
CPC ............. H10K 50/865; H10K 59/8792; H10K 2102/351; H10K 59/35
USPC ........................................................... 257/40
See application file for complete search history.

(56) References Cited

U.S. PATENT DOCUMENTS

2017/0365806 A1* 12/2017 Uesaka .................. H10K 50/13

* cited by examiner

*Primary Examiner* — Monica D Harrison
(74) *Attorney, Agent, or Firm* — WPAT LAW; Anthony King

(57) ABSTRACT

The present disclosure provides a light emitting element including a substrate, an anti-reflective layer, multiple light blocking layers, a cover layer, a conductive layer and multiple protrusions. The anti-reflective layer is in contact with a first surface of the substrate. The multiple light blocking layers are in contact with a first surface of the anti-reflective layer. The cover layer is in contact with the first surface of the anti-reflective layer, and covers the multiple light blocking layers. The conductive layer is in contact with a second surface of the substrate, wherein the second surface is in parallel and opposite to the first surface. The multiple protrusions are disposed on the second surface of the substrate and cover a portion of the conductive layer.

13 Claims, 12 Drawing Sheets

30

40

LIGHT EMITTING ELEMENT

FIELD OF THE PRESENT DISCLOSURE

The present disclosure relates to a light emitting element, and more particularly to an organic light emitting element.

DESCRIPTION OF THE PRIOR ART

Organic light emitting devices are extensively used in high-end electronic devices. However, due to limitations of current techniques, light emitting effects of organic light emitting devices cannot be effectively controlled, in a way that severe ghosting and optical crosstalk are likely produced, such that optical effects of organic light emitting devices may not be as good as expected. Organic light emitting devices are used in various applications, for example, head-up displays (HUDs), smart glasses, telescope devices and scope device. If halos of generated by organic light emitting devices are not effectively controlled, the feasibility for the applications above is greatly reduced. The present disclosure provides a device for overcoming the dilemma above.

SUMMARY OF THE PRESENT DISCLOSURE

The present disclosure provides a light emitting element including a substrate, an anti-reflective layer, multiple light blocking layers, a cover layer, a conductive layer and multiple protrusions. The anti-reflective layer is in contact with a first surface of the substrate. The multiple light blocking layers are in contact with a first surface of the anti-reflective layer. The cover layer is in contact with the first surface of the anti-reflective layer, and covers the multiple light blocking layers. The conductive layer is in contact with a second surface of the substrate, wherein the second surface is in parallel and opposite to the first surface. The multiple protrusions are disposed on the second surface of the substrate and cover a portion of the conductive layer.

In some embodiments, an average reflectance of the anti-reflective layer is smaller than a first value, and a reflectance of the anti-reflective layer with respect to a predetermined wavelength is smaller than a second value, wherein the first value is smaller than the second value.

In some embodiments, the predetermined wavelength includes a wavelength of visible light.

In some embodiments, two adjacent protrusions of the multiple protrusions have an organic light emitting element including an organic material in between.

In some embodiments, the anti-reflective layer absorbs light emitted by the organic light emitting unit and reflected by the conductive layer.

In some embodiments, a distance between each edge of the two adjacent protrusions of the organic light emitting unit is greater than a distance between each edge of the two adjacent light blocking layers of the multiple light blocking layers.

In some embodiments, one of the multiple protrusions has an edge, which is offset from an edge of one of the multiple light blocking layers in a vertical direction.

The present disclosure provides a light emitting element including a substrate, an anti-reflective layer, a patterning light blocking layer, a cover layer, a conductive layer and multiple protrusions. The anti-reflective layer is below the substrate. The patterning light blocking layer is below the anti-reflective layer and has an opening. The cover layer is below the patterning light blocking layer. The multiple protrusions are disposed on the substrate, and two adjacent protrusions of the multiple protrusions have an organic light emitting element including an organic material in between. The organic light emitting unit includes a first light emitting unit, a second light emitting unit and a third light emitting unit.

In some embodiments, the anti-reflective layer is in direct contact with the substrate and the patterning light blocking layer.

In some embodiments, the anti-reflective layer absorbs light emitted by the organic light emitting unit and reflected by the conductive layer.

In some embodiments, an average reflectance of the anti-reflective layer is smaller than a first value, and a reflectance of the anti-reflective layer with respect to a wavelength of visible light is smaller than a second value, wherein the first value is smaller than the second value.

In some embodiments, the first value is smaller than 0.6%, and the second value is smaller than 1%.

In some embodiments, the organic light emitting unit includes a first light emitting unit, a second light emitting unit and a third light emitting unit, each of which having an effective light emitting region with a size defined by an anode located below each of the light emitting units.

DETAILED DESCRIPTION OF THE EMBODIMENTS

Figure 1:
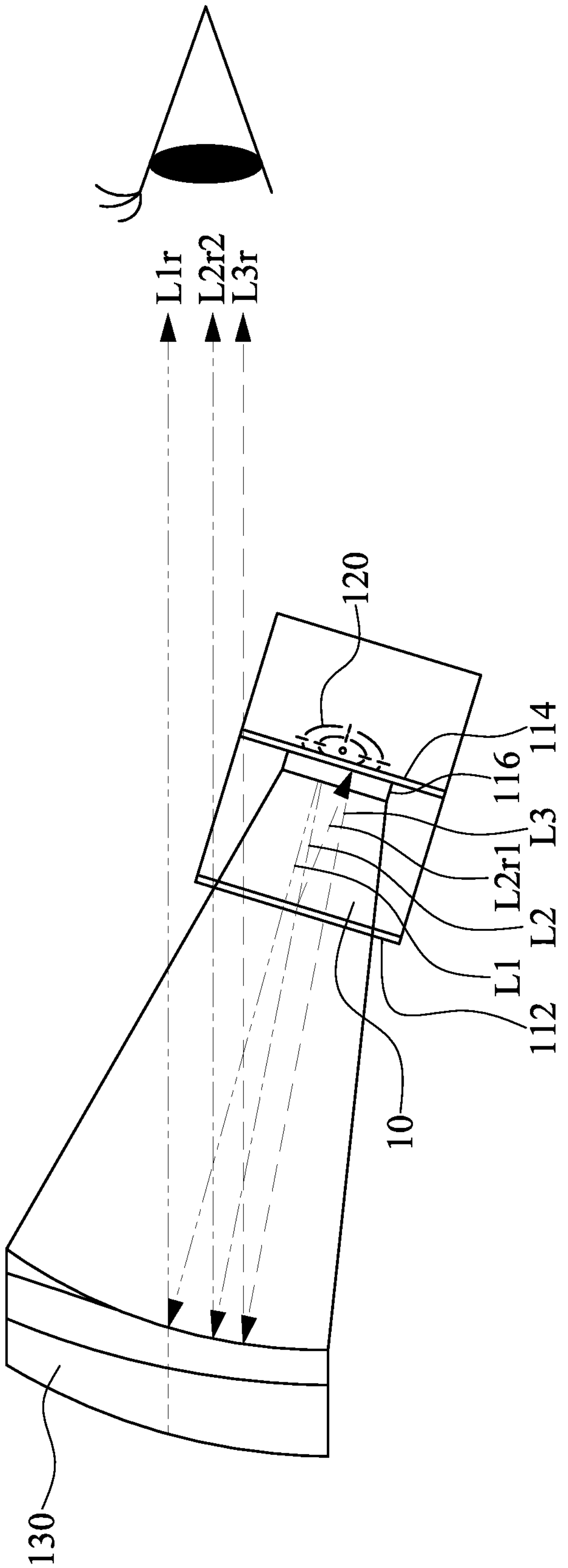
FIG. 1 is a schematic diagram of an application scenario of a light emitting element according to an embodiment.

FIG. 1 shows a schematic diagram of an application scenario of a light emitting element 10 according to an embodiment. The light emitting element 10 includes a first element 112 and a second element 114. The first element 112 can include a glass material, and the second element 114 can include an organic light emitting material. The light emitting element 10 can form a bullseye pattern 120 on a spectrometer 130, so that the human eye can identify the bullseye pattern 120.

In some embodiments, the light emitting element 10 emits a light L1, which travels to the spectrometer 130 through the first element 112 and is reflected by the spectrometer 130 to become a light L1*r* visible to the human eye. As shown in FIG. 1, the light L1 is not reflected while passing through the first element 112. In some embodiments, the light emitting element 10 emits a light L2, which is partially reflected while passing through the first element 112 and forms a light L2*r*1. The remaining portion of the light L2 that is not reflected travels to the spectrometer 130, and is reflected by the spectrometer 130 to become a light L2*r*2 visible to the human eye. The human eye observes the bullseye pattern 120 with the light L1*r* or the light L2*r*2, thereby forming an effective field of view (FOV). In some embodiments, the light L2r1 is also reflected to form a light L3, which travels to the spectrometer 130 through the first element 112 and is reflected by the spectrometer 130 to become a light L3r visible to the human eye. Since the light L3r received by the human eye generates interference on the light L1r or the light L2r2 to cause an issue such as ghosting or optical crosstalk, the optical effect of the light emitting element 10 is not as good as expected.

Figure 2:
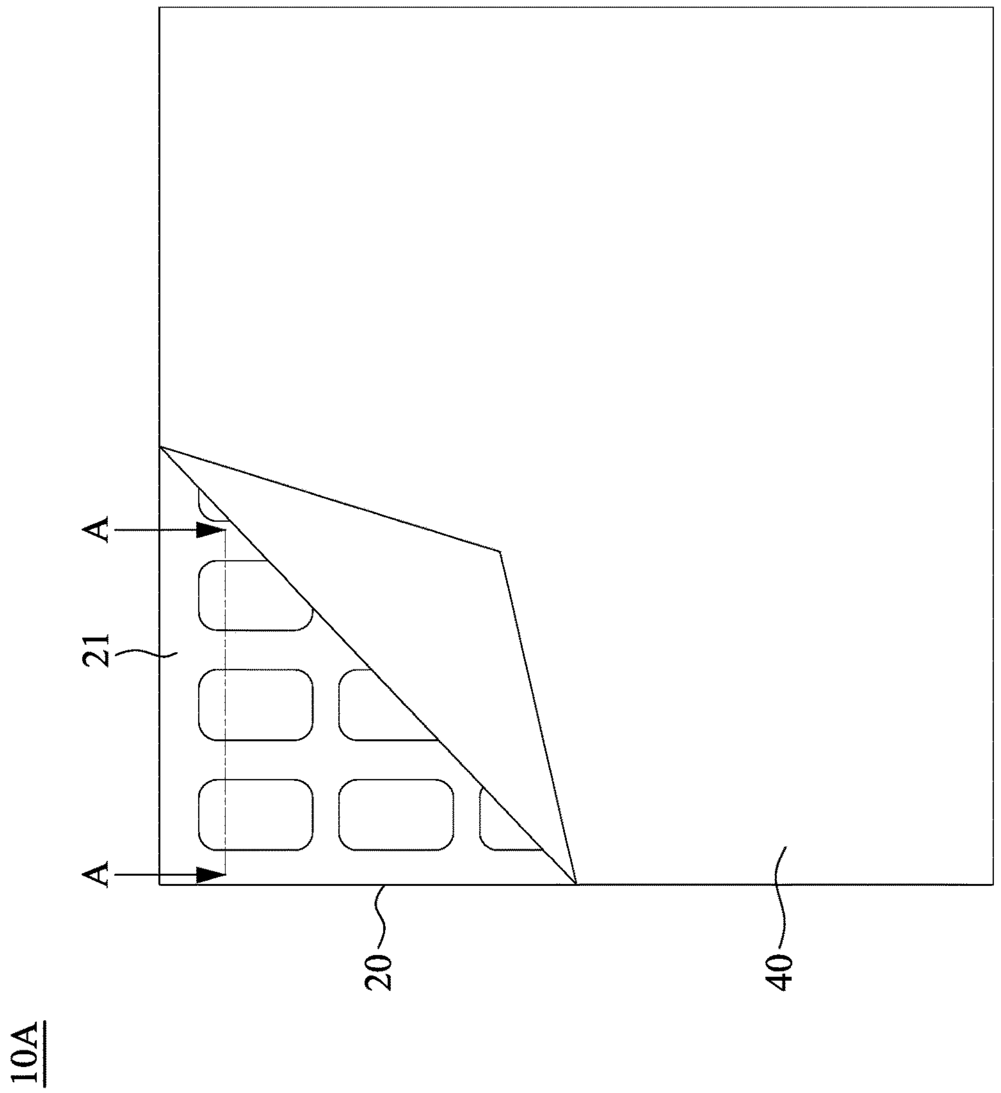
FIG. 2 is a plan view of an intermediate product of a light emitting element.

FIG. 2 shows a plan view of an example of an intermediate product of a light emitting element 10A. The light emitting element 10A includes a light emitting layer 20 and a cover layer 40 located above the light emitting layer 20. For the light emitting layer 20, a spacer 21 can be designed to provide a recess array used to accommodate a light emitting pixel array. In some embodiments, the spacer 21 can include a photosensitive material.

Figure 3:
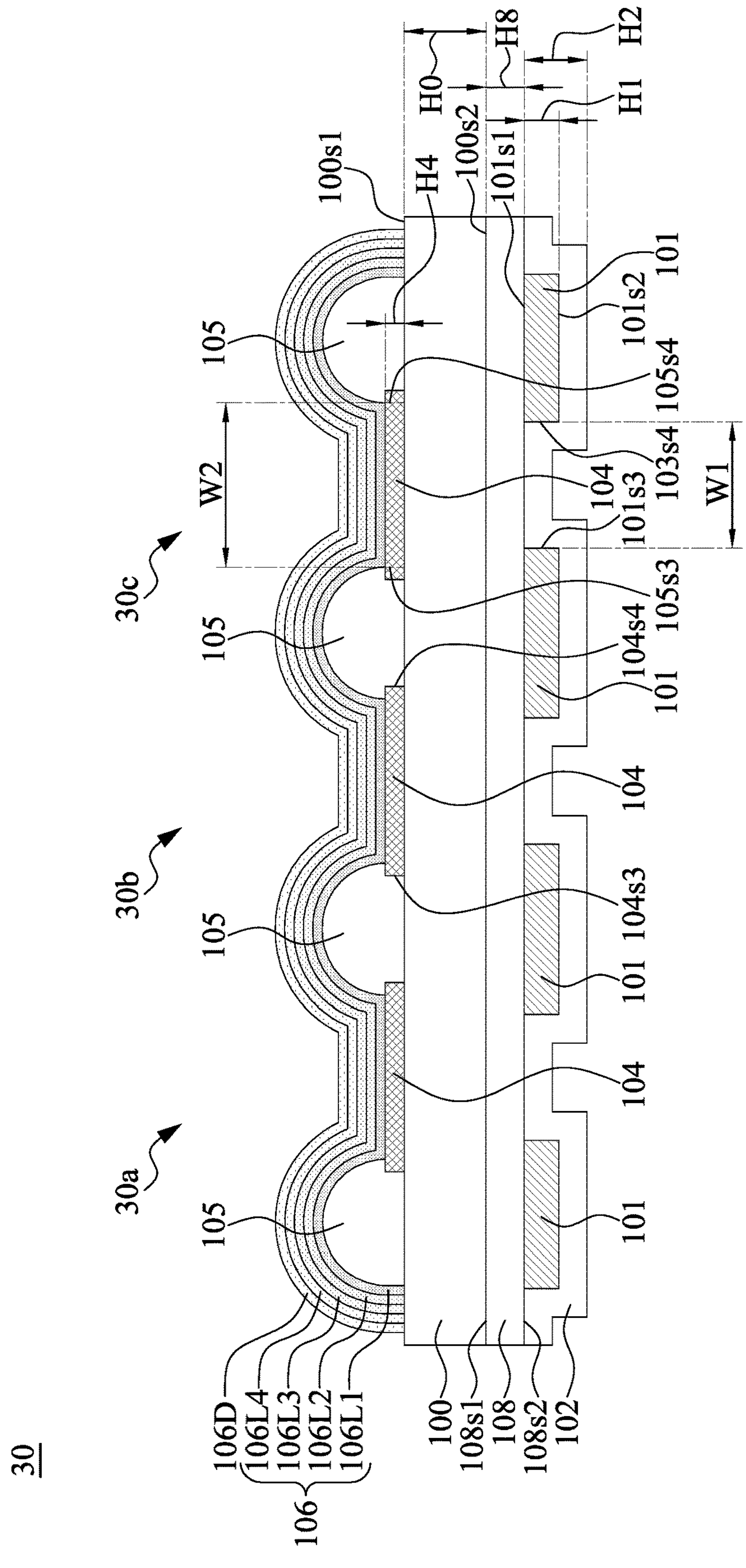
FIG. 3 is an example of a section diagram along the line A-A' in FIG. 2.

FIG. 3 shows an example of a section diagram along the line AA in FIG. 2 and depicts only a light emitting region. For brevity and clarity, the cover layer 40 is omitted. In some embodiments, the light emitting element 30 includes a substrate 100, a light blocking layer 101, a cover layer 102, a first electrode 104, a protrusion 105, an organic light emitting stack layer 106, a second electrode 106D and an anti-reflective layer 108. In some embodiments, the organic light emitting stack layer 106 includes a carrier injection layer 106L1, a carrier transport layer 106L2, an organic emissive layer 106L3, and an organic carrier transport layer 106L4. In some embodiments, the light emitting element 30 further includes a first organic light emitting unit 30a, a second organic light emitting unit 30b and a third organic light emitting unit 30c.

In some embodiments, the substrate 100 can include a thin-film transistor (TFT) array. In some embodiments, the substrate 100 includes a base material (not shown), a dielectric layer (not shown), and one or more circuits (not shown) disposed on the base material or in the base material. In some embodiments, the base material is a transparent base material, or is at least partially transparent. In some embodiments, the base material is a non-flexible base material, and a material of such base material can include glass, quartz, low-temperature polysilicon (LTPS) or other appropriate materials. In some embodiments, the base material is a flexible substrate, and a material of such base material can include transparent epoxy resin, polyimide, polyvinyl chloride, methyl methacrylate or other appropriate materials. The dielectric layer is disposed on the base material as needed. In some embodiments, the dielectric layer can include silicon oxide, silicon nitride, silicon oxynitride, or other appropriate materials.

In some embodiments, the circuit can include a complementary metal oxide semiconductor (CMOS) circuit, or multiple transistors and multiple capacitors adjacent to the transistors, wherein the transistors and the capacitors are formed on the dielectric layer. In some embodiments, each of the transistors is a thin-film transistor (TFT). Each of the transistors includes a source/drain region (including at least one source region and one drain region), a channel region located in the source/drain region, a gate electrode disposed above the channel region, and a gate insulator located between the channel region and the gate electrode. The channel region of the transistor can be formed of a semiconductor material, for example, silicon or other elements selected from group IV or group III and group V.

The anti-reflective layer 108 is below the substrate 100. The substrate 100 can be in direct contact with an upper surface 108s1 of the anti-reflective layer 108. The substrate 100 is not in direct contact with a lower surface 108s2 of the anti-reflective layer 108. The anti-reflective layer 108 can be disposed on a lower surface 100s2 of the substrate 100. The lower surface 100s2 of the substrate 100 is in parallel and opposite to the upper surface 100s1 of the substrate 100. A thickness H8 of the anti-reflective layer 108 is smaller than a thickness H0 of the substrate 100. In some embodiments, the anti-reflective layer 108 includes an anti-reflective coating (ARC) so as to reduce the reflectance of light and to increase a transmittance of light. When secondary reflection of light is produced on the ARC, the original reflected light is interfered to thus reduce the reflected light. The anti-reflective layer 108 can include, for example, calcium fluoride, magnesium fluoride, titanium oxide, lead sulfide, lead selenide, a vinyl silsesquioxane hybrid film, or a diamond film. In some embodiments, the anti-reflective layer 108 includes a layer of a single material. In some embodiments, the anti-reflective layer 108 includes a composite layer formed of a plurality of materials. In some embodiments, the anti-reflective layer 108 includes an organic material. In some embodiments, the anti-reflective layer 108 includes an inorganic material.

In some embodiments, an average reflectance of the anti-reflective layer 108 for all wavelengths is smaller than a first value. In some embodiments, a reflectance of the anti-reflective layer 108 for a predetermined wavelength is smaller than a second value, wherein the predetermined wavelength includes wavelength of visible light. In some embodiments, the first value is smaller than the second value. The first value is smaller than 0.6%, and the second value is smaller than 1%. In some embodiments, the first value is greater than or equal to the second value. In some embodiments, the specific wavelength is within a range between about 420 nm and about 680 nm. In some embodiments, the specific wavelength is within a range between about 380 nm and about 780 nm.

The anti-reflective layer 108 can reduce reflected light that travels downward from the substrate 100. Under a predetermined wavelength, light reflected by the upper surface 108s1 of the anti-reflective layer 108 and light reflected by the lower surface 108s2 of the anti-reflective layer 108 are counteracted, leading an extremely low reflected energy. Considering that an incident energy is equal to a reflected energy plus a transmitted energy, a transmitted energy is corresponding enhanced. Thus, the anti-reflective layer 108 can also be referred to as an antiglare or anti-reflection coating.

In some embodiment, the anti-reflective layer 108 can absorb a portion of light that travels downward from the substrate 100. In other words, light that travels downward from the substrate 100 comes into contact with the anti-reflective layer 108 and is not reflected at all or is reflected minimally, so that ghosting and optical crosstalk caused by other light can be reduced to render a clear image. Referring to the embodiment in FIG. 1, the anti-reflective layer 108 can be disposed at the first element 112 so as to absorb the reflected light L2r1 of the light L2, thereby significantly reducing the light L3 and the light L3r to prevent from causing ghosting and optical crosstalk on the other lights L1r and L2r2. Thus, the anti-reflective layer 108 can increase contrast of light emitting units as well as enhancing optical effects of the light emitting element 30.

The plurality of light blocking layers 101 are formed below the anti-reflective layer 108. The plurality of light blocking layers 101 are in direct contact with the lower surface 108s2 of the anti-reflective layer 108. The plurality of light blocking layers 101 can also be collectively referred to as a patterning light blocking layer 101. The plurality of light blocking layers 101 are separated from one another by a distance W1. Parts by which the plurality of light blocking layers 101 are separated from one another can also be referred to as openings having a width corresponding to the distance W1. A thickness H1 of the patterning light blocking layer 101 is smaller than the thickness H0 of the substrate 100. The thickness H1 of the patterning light blocking layer 101 can be substantially equal to the thickness H8 of the anti-reflective layer 108. The thickness H1 of the patterning light blocking layer 101 can also be smaller than the thickness H8 of the anti-reflective layer 108. The thickness H1 of the patterning light blocking layer 101 can also be greater than the thickness H8 of the anti-reflective layer 108.

In some embodiments, the plurality of light blocking layers 101 can absorb 90% or more visible light. In some embodiments, the light blocking layer 101 can includes a black material. In some embodiments, the light blocking layer 101 includes a layer of a single material. In some embodiments, the light blocking layers 101 include a composite layer formed of a plurality of materials. In some embodiments, the light blocking layer 101 includes an organic material. In some embodiments, the light blocking layer 101 includes an inorganic material.

The cover layer 102 is formed below the anti-reflective layer 108 and covers the plurality of light blocking layers 101. The cover layer 102 is formed in the opening of the patterning light blocking layer 101. The cover layer 102 is in contact with the lower surface 101*s*2 of the light blocking layer 101. The cover layer 102 is in contact with two side surfaces 101*s*3 and 101*s*4 of the light blocking layer 101. The cover layer 102 covers the lower surface 101*s*1 and the two side surfaces 101*s*3 and 103*s*4 of the light blocking layer 101. The cover layer 102 is formed in a gaps among the plurality of light blocking layers 101. A thickness H2 of the cover layer 102 can be smaller than the thickness H0 of the substrate 100. The thickness H2 of the cover layer 102 can be substantially equal to the thickness H0 of the substrate 100. The thickness H2 of the cover layer 102 can be greater than the thickness H0 of the substrate 100. The thickness H2 of the cover layer 102 can also be greater than the thickness H1 of the light blocking layer 101. The thickness H2 of the cover layer 102 can be greater than the thickness H8 of the anti-reflective layer 108.

The plurality of first electrodes 104 are formed on the substrate 100. The plurality of first electrodes 104 are in contact with the upper surface 100*s*1 of the substrate 100. The plurality of first electrodes 104 are separated from one another. The plurality of first electrodes 104 are in direct contact with the substrate 100. The plurality of first electrodes 104 are electrically connected to the substrate 100.

The plurality of protrusions 105 are formed on a portion of an upper surface of the first electrode 104. A peripheral region of the first electrode 104 is covered by the protrusion 105. In some embodiments, the edges and corners of the first electrode 104 are completely covered by the protrusion 105. In some embodiments, a sidewall of the first electrode 104 is completely in contact with the protrusion 105. In some embodiments, two protrusions 105 in the gap between two first electrodes 104 are separated from each other. The light blocking layer 101 is electrically insulated from the first electrode 104 disposed on the cover layer 102 via the cover layer 102. In some embodiments, the anti-reflective layer 108 absorbs light emitted by the organic light emitting unit and reflected by the first electrode 104 or the conductive layer.

In some embodiments, a thickness H4 of the first electrode 104 is smaller than the thickness H1 of the light blocking layer 101. The thickness H4 of the first electrode 104 can be substantially equal to the thickness H1 of the light blocking layer 101. The thickness H4 of the first electrode 104 can be greater than the thickness H1 of the light blocking layer 101. In some embodiments, the thickness H4 of the first electrode 104 is smaller than the thickness H8 of the anti-reflective layer 108. The thickness H4 of the first electrode 104 can be substantially equal to the thickness H8 of the anti-reflective layer 108. The thickness H4 of the first electrode 104 can be greater than the thickness H8 of the anti-reflective layer 108.

The first electrode 104 can have a total thickness of between about 1500 Å and 2700 Å. In some embodiments, the first electrode 104 can have a total thickness of between about 1800 Å and 2200 Å. In some embodiments, the first electrode 104 has a total thickness of about 2000 Å. The first electrode 104 can be a conductive layer. The first electrode 104 can include ITO, IZO, IGZO, an AlCu alloy, a AgMo alloy, ITO (or IZO or IGZ) between about 50 Å and about 500 Å and a metal film (Ag, Al, Mg or Au) between 500 Å and about 200 Å and ITO (or IZO or IGZO) between about 50 Å and about 1000 Å.

In some embodiments, the first electrode 104 is a composite structure. For example, the first electrode 104 includes a conductive film and a transparent conductive film located thereon. The conductive film is located between the transparent conductive film and the substrate 100. In some embodiments, the conductive film includes Al, Au, Ag and Cu. In some embodiments, the transparent conductive film includes In, Sn, graphite, Zn and O. In some embodiments, the first electrode 104 includes a transparent conductive film. In some embodiments, the first electrode 104 includes indium tin oxide (ITO). In some embodiments, the first electrode 104 includes indium zinc oxide (IZO). In some embodiments, the first electrode 104 includes indium gallium zinc oxide (IGZO). In some embodiments, a roughness Ra of the transparent conductive film is smaller than 10 Å. A thickness of the conductive film can be between about 1500 Å and 3000 Å. The thickness of the transparent conductive film can be between about 80 Å and about 1000 Å.

In some embodiments, the first electrode 104 has at least three different films. The conductive film (for example, Al, Cu, Ag and Au) is sandwiched between two conductive transparent films. In some cases, one of the two transparent conductive films is ITO, and has one side in contact with the substrate 100 and the other side in contact with the conductive film. In some cases, one of the two transparent conductive films is ITO, and has one side in contact with the conductive film and the other side in contact with the protrusion 105 or a light emitting material.

In some embodiments, each protrusion 105 has a curved surface, which protrudes away from the substrate 100 and covers an outer peripheral region of the first electrode 104. The protrusions 105 can be in different shapes. In some embodiments, the protrusion 105 has a curved surface. In some embodiments, the protrusion 105 has a trapezoidal shape. In some embodiments, the protrusion 105 has a rectangular shape. A pattern of the protrusions 105 are designed according to a pixel layout, and patterned protrusions 105 can be referred to as a pixel defined layer (PDL). The protrusions 105 are disposed on the substrate 100. Each protrusion 105 fills the gap between two adjacent first electrodes 104. Each first electrode 104 is partially covered by the protrusion 105. The protrusion 105 can include a photosensitive material. In FIG. 3, an area of the light blocking layer 101 in a horizontal direction is greater than an area of each of the protrusions 105.

The protrusion 105 has an edge on the upper surface covering the first electrode 104. The light blocking layer 101 has an edge near a center of the first electrode 104. The edge of the light blocking layer 101 is not aligned with the edge of the protrusion 105. The edge of the protrusion 105 and the edge of the light blocking layer 101 have an offset in between. The edge of the protrusion 105 and the edge of the light blocking layer 101 have an offset in a vertical direction. A percentage of the offset to a width of the light blocking layer 101 can be greater than or equal to 1%. The percentage of the offset to the width of the light blocking layer 101 can be greater than or equal to 10%. The percentage of the offset to the width of the light blocking layer 101 can be greater than or equal to 20%. The percentage of the offset to a width of the light blocking layer 101 can be greater than or equal to 30%. The percentage of the offset to the width of the light blocking layer 101 can be greater than or equal to 40%.

In some embodiments, the spacer 21 in FIG. 2 includes the plurality of protrusions 105 to define a light emitting pixel pattern. A recess is located between two adjacent protrusions 105 and provides a space for accommodating light emitting pixels. Observing from the section diagram, a person skilled in the art would be able to understand that the protrusions 105 are depicted in a disconnected manner. However, observing from the schematic plan view of FIG. 2, the protrusions 105 can be connected to one another by other parts of the spacer 21.

The light emitting element 30 includes a light emitting array, which includes a first organic light emitting unit 30*a*, a second organic light emitting unit 30*b* and a third organic light emitting unit 30*c*. The organic light emitting unit in the present application can also be referred to as a light emitting pixel. In some embodiments, the light emitting unit 30*a* includes a first electrode 104, a carrier injection layer 106L1 above the protrusion 105 and the first electrode 104, a carrier transport layer 106L2 above the carrier injection layer 106L1, an organic emissive layer 106L3 above a portion of the carrier transport layer 106L2, and an organic carrier transport layer 106L4 above the organic emissive layer 106L3. The carrier injection layer 106L1, the carrier transport layer 106L2, the organic emissive layer 106L3 and the organic carrier transport layer 106L4 can be collectively referred to as the organic light emitting stack layer 106.

In some embodiments, the carrier injection layer 106L1 is disposed between the first electrode 104 and the carrier transport layer 106L2. The light emitting unit 30*a* includes an organic material, which can be disposed in any one of the carrier transport layer, the carrier injection layer and the organic emissive layer in the light emitting unit 30*a* according to different embodiments. Moreover, the organic material has an absorption rate of greater than or equal to 50% for a predetermined wavelength in some embodiments, an absorption rate of greater than or equal to 60% for a predetermined wavelength in some embodiments, an absorption rate of greater than or equal to 70% for a predetermined wavelength in some embodiments, an absorption rate of greater than or equal to 80% for a predetermined wavelength in some embodiments, an absorption rate of greater than or equal to 90% for a predetermined wavelength in some embodiments, or an absorption rate of greater than or equal to 95% for a predetermined wavelength in some embodiments. The predetermined wavelength is not greater than 400 nm in some embodiments, not greater than 350 nm in some embodiments, not greater than 300 nm in some embodiments, not greater than 250 nm in some embodiments, not greater than 200 nm in some embodiments, not greater than 150 nm in some embodiments, or not greater than 100 nm in some embodiments.

In FIG. 3, the distance between the plurality of light blocking layers 101 is W1, and a distance between two adjacent protrusions 105 is W2. In some embodiments, the distance W2 between two adjacent protrusions 105 is greater than the distance W1 between the plurality of light blocking layers 101. In some embodiments, the distance W2 between two adjacent protrusions 105 can define an area of an effective light emitting region. Since the distance W1 between the plurality of light blocking layers 101 is smaller than W2, the plurality of light blocking layers 101 can control light emitted by the first electrode 104 to thereby improve an imaging effect of an image.

Moreover, because the light blocking layer 101 can block ambient light traveling upward from the substrate 100, optical crosstalk between the ambient light and the light emitted by the light emitting unit 30*a* can be reduced. Alternatively speaking, because the light blocking layer 101 can absorb 90% or more the ambient light traveling upward from the substrate 100, optical crosstalk between the ambient light and the light emitted by the light emitting unit 30*a* can be reduced.

The protrusion 105 has an absorption rate of greater than or equal to 50% for a predetermined wavelength in some embodiments, an absorption rate of greater than or equal to 60% for a predetermined wavelength in some embodiments, an absorption rate of greater than or equal to 70% for a predetermined wavelength in some embodiments, an absorption rate of greater than or equal to 80% for a predetermined wavelength in some embodiments, an absorption rate of greater than or equal to 90% for a predetermined wavelength in some embodiments, or an absorption rate of greater than or equal to 95% for a predetermined wavelength in some embodiments. In some embodiments, the predetermined wavelength is not greater than 400 nm in some embodiments, not greater than 350 nm in some embodiments, not greater than 300 nm in some embodiments, not greater than 250 nm in some embodiments, not greater than 200 nm in some embodiments, not greater than 150 nm in some embodiments, or not greater than 100 nm in some embodiments.

The carrier injection layer 106L1 is disposed on the cover layer 102, the protrusion 105 and an exposed surface of the first electrode 104. The carrier injection layer 106L1 continuously covers the protrusion 105 and the exposed surface of the first electrode 104. In some embodiments, the exposed surface of each first electrode 104 is an effective light emitting region configured to be used for one light emitting unit 30*a*. Optionally, the carrier injection layer 106L1 is in contact with the protrusion 105. In some embodiments, the carrier injection layer 106L1 is in contact with the first electrode 104. In some embodiments, the carrier injection layer 106L1 is an organic body. In some embodiments, the carrier injection layer 106L1 is configured to perform hole injection. In some embodiments, the carrier injection layer 106L1 is a hole injection layer. In some embodiments, the carrier injection layer 106L1 can have a thickness of between about 80 Å and about 500 Å.

The carrier transport layer 106L2 is disposed on the cover layer 102, the protrusion 105 and the exposed surface of the first electrode 104. The carrier transport layer 106L2 is disposed above the carrier injection layer 106L1 and completely covers the carrier injection layer 106L1. The carrier injection layer 106L1 is disposed below the carrier transport layer 106L2. The carrier transport layer 106L2 continuously covers the carrier injection layer 106L1. The carrier transport layer 106L2 covers the plurality of protrusions 105 and the plurality of first electrodes 104. Optionally, the carrier transport layer 106L2 is in contact with the carrier injection layer 106L1. In some embodiments, the carrier transport layer 106L2 is an organic body. In some embodiments, the carrier transport layer 106L2 is configured to perform hole transport. In some embodiments, the carrier transport layer 106L2 is a first hole transport layer. In some embodiments, the carrier injection layer 106L2 can have a thickness of between about 80 Å and about 500 Å.

The organic emissive layer 106L3 is disposed on the cover layer 102, the protrusion 105 and the exposed surface of the first electrode 104. The organic emissive layer 106L3 is disposed above the carrier transport layer 106L2 and completely covers the carrier transport layer 106L2. The carrier transport layer 106L2 is disposed below the organic emissive layer 106L3. The organic emissive layer 106L3 continuously covers the carrier transport layer 106L2. The organic emissive layer 106L3 covers the plurality of protrusions 105 and the plurality of first electrodes 104. Optionally, the organic emissive layer 106L3 is in contact with the carrier transport layer 106L2. The organic emissive layer 106L3 is configured to emit a first color.

The organic emissive layer 106L3 has an absorption rate of greater than or equal to 50% for a predetermined wavelength in some embodiments, an absorption rate of greater than or equal to 60% for a predetermined wavelength in some embodiments, an absorption rate of greater than or equal to 70% for a predetermined wavelength in some embodiments, an absorption rate of greater than or equal to 80% for a predetermined wavelength in some embodiments, an absorption rate of greater than or equal to 90% for a predetermined wavelength in some embodiments, or an absorption rate of greater than or equal to 95% for a predetermined wavelength in some embodiments. The predetermined wavelength is not greater than 400 nm in some embodiments, not greater than 350 nm in some embodiments, not greater than 300 nm in some embodiments, not greater than 250 nm in some embodiments, not greater than 200 nm in some embodiments, not greater than 150 nm in some embodiments, or not greater than 100 nm in some embodiments.

In some embodiments, at least one of the carrier transport layer 106L2 and the organic emissive layer 106L3 includes an organic material. The organic material can include a molecular structure having a resonance structure. The organic material can be selected from a group consisting of spiro-triarylamine, bis-triarylamine and a combination thereof. In some embodiments, at least one of the carrier transport layer 106L2 and the organic emissive layer 106L3 includes spiro-triarylamine. In some embodiments, at least one of the carrier transport layer 106L2 and the organic emissive layer 106L3 includes bis-triarylamine.

The organic carrier transport layer 106L4 is disposed on the cover layer 102, the protrusion 105 and the exposed surface of the first electrode 104. The organic carrier transport layer 106L4 is disposed above the organic emissive layer 106L3 and completely covers the organic emissive layer 106L3. The organic emissive layer 106L3 is disposed below the organic carrier transport layer 106L4. The organic carrier transport layer 106L4 continuously covers the organic emissive layer 106L3. The organic carrier transport layer 106L4 covers the plurality of protrusions 105 and the plurality of first electrodes 104. Optionally, the organic carrier transport layer 106L4 is in contact with the organic emissive layer 106L3.

The second electrode 106D is disposed on the cover layer 102, the protrusion 105 and the exposed surface of the first electrode 104. The second electrode 106D is located above the organic carrier transport layer 106L4 and completely covers the organic carrier transport layer 106L4. In some cases, the second electrode 106D is patterned to cover only the effective light emitting region of each light emitting pixel. In some cases, the second electrode 106D is in contact with the organic carrier transport layer 106L4.

The second electrode 106D can have a thickness of between about 80 Å and about 500 Å. In some embodiments, the second electrode 106D can have a thickness of between about 80 Å and about 150 Å. In some embodiments, the second electrode 106D can have a thickness of between about 150 Å and about 200 Å. In some embodiments, the second electrode 106D can have a thickness of between about 200 Å and about 300 Å. In some embodiments, the second electrode 106D can have a thickness of between about 300 Å and about 400 Å. In some embodiments, the second electrode 106D can have a thickness of between about 400 Å and about 500 Å.

In some embodiments, the second electrode 106D can be a cathode. The second electrode 106D can be a metal material, for example, Ag or Mg. In some embodiments, the second electrode 106D includes ITO or IZO. In some embodiments, the second electrode 106D is a composite structure. For example, the second electrode 106D includes a conductive film and a transparent conductive film located thereon. The conductive film is located between the transparent conductive film and the organic carrier transport layer 106L4. In some embodiments, the conductive film includes Al, Au, Ag, Cu, Mg and Mo. In some embodiments, the transparent conductive film includes In, Sn, graphite, Zn and O. In some embodiments, the transparent conductive film is ITO. In some embodiments, the transparent conductive film is IZO. In some embodiments, the transparent conductive film is located between the conductive film and the organic carrier transport layer 106L4.

In FIG. 3, the light emitting element 30 includes the substrate 100, the plurality of protrusions 105 on the substrate 100, and the plurality of light emitting units separated by the protrusions 105.

These light emitting units include the first light emitting unit 30*a*, the second light emitting unit 30*b* and the third light emitting unit 30*c*. In some embodiments, the first light emitting unit 30*a*, the second light emitting unit 30*b* and the third light emitting unit 30*c* are adjacent to one another. In some embodiments, the second light emitting unit 30*b* and the third light emitting unit 30*c* have structures similar to the first light emitting unit 30*a*. Moreover, although the first light emitting unit 30*a*, the second light emitting unit 30*b* and the third light emitting unit 30*c* are depicted to have similar characteristics, such is merely an example and is not intended for limitations to the embodiments. These first light emitting unit 30*a*, the second light emitting unit 30*b* and the third light emitting unit 30*c* can have similar structures or different structures to satisfy desired functional requirements.

The first light emitting unit 30*a*, the second light emitting unit 30*b* and the third light emitting unit 30*c* can be different from one another at least in a thickness of the organic light emitting stack layer. In some embodiments, the first light emitting unit 30*a* emits green light, the second light emitting unit 30*b* emits red light and the third light emitting unit 30*c* emits blue light.

In some embodiments, the light emitting units 30*a*, 30*b* and 30*c* are configured to be divided into at least three different groups, wherein each group emits a color different from colors of the other groups. The thickness of each organic light emitting stack layer can be associated with the colors displayed by the corresponding light emitting units 30*a*, 30*b* and 30*c*. In some embodiments, compared to the other light emitting units emitting different colors, the first light emitting unit 30*a* emits green light, and the organic light emitting stack layer of the first light emitting unit 30*a* can have the smallest thickness. In some embodiments, compared to the other light emitting units emitting different colors, the second light emitting unit 30*b* emits red light, and a thickness of the organic light emitting stack layer of the second light emitting unit 30*b* can be between the thickness of the organic light emitting stack layer of the first light emitting unit 30*a* and a thickness of the organic light emitting stack layer of the third light emitting unit 30*c*. In some embodiments, compared to the other light emitting units emitting different colors, the third light emitting unit 30*c* emits blue light, and the organic light emitting stack layer of the third light emitting unit 30*b* can have the largest thickness. The organic light emitting stack layers of the first light emitting unit 30*a*, the second light emitting unit 30*b* and the third light emitting unit 30*c* can be formed by various processes such as vapor deposition, liquid spray or inkjet printing.

In some embodiments, the first, second and third light emitting units 30*a*, 30*b* and 30*c* can be different from one another at least in thickness differences of the carrier transport layers of the first, second and third light emitting units 30*a*, 30*b* and 30*c*.

In some embodiments, the light emitting units 30*a*, 30*b* and 30*c* are configured to be divided into at least three different groups, wherein each group emits a color different from colors of the other groups. The thickness of the carrier transport layer can be associated with the color displayed by the corresponding light emitting unit 30*a*. In some embodiments, compared to the other light emitting units emitting different colors, the first light emitting unit 30*a* emits green light, and the carrier transport layer of the first light emitting unit 30*a* can have the smallest thickness. In some embodiments, compared to the other light emitting units emitting different colors, the second light emitting unit 30*b* emits red light, and a thickness of the carrier transport layer of the second light emitting unit 30*b* can be between the thickness of the carrier transport layer of the first light emitting unit 30*a* and a thickness of the carrier transport layer in the third light emitting unit 30*c*. In some embodiments, compared to the other light emitting units emitting different colors, the third light emitting unit 30*c* emits blue light, and the carrier transport layer of the third light emitting unit 30*c* can have the largest thickness.

FIG. 4A to FIG. 4G depict different stages of a method for manufacturing the light emitting element 40 according to an embodiment.

Figure 4A:
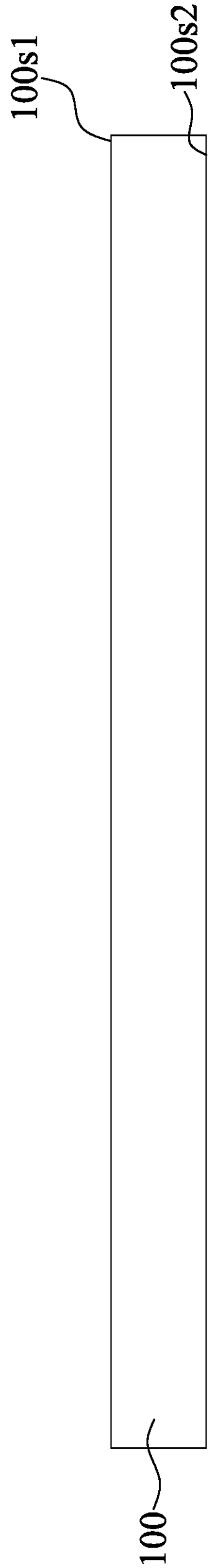
FIG. 4A to FIG. 4G depict different stages of a method for manufacturing a light emitting element according to an embodiment.

In FIG. 4A, the substrate 100 is provided, the substrate 100 having the upper surface 100*s*1 and the lower surface 100*s*2.

Figure 4B:
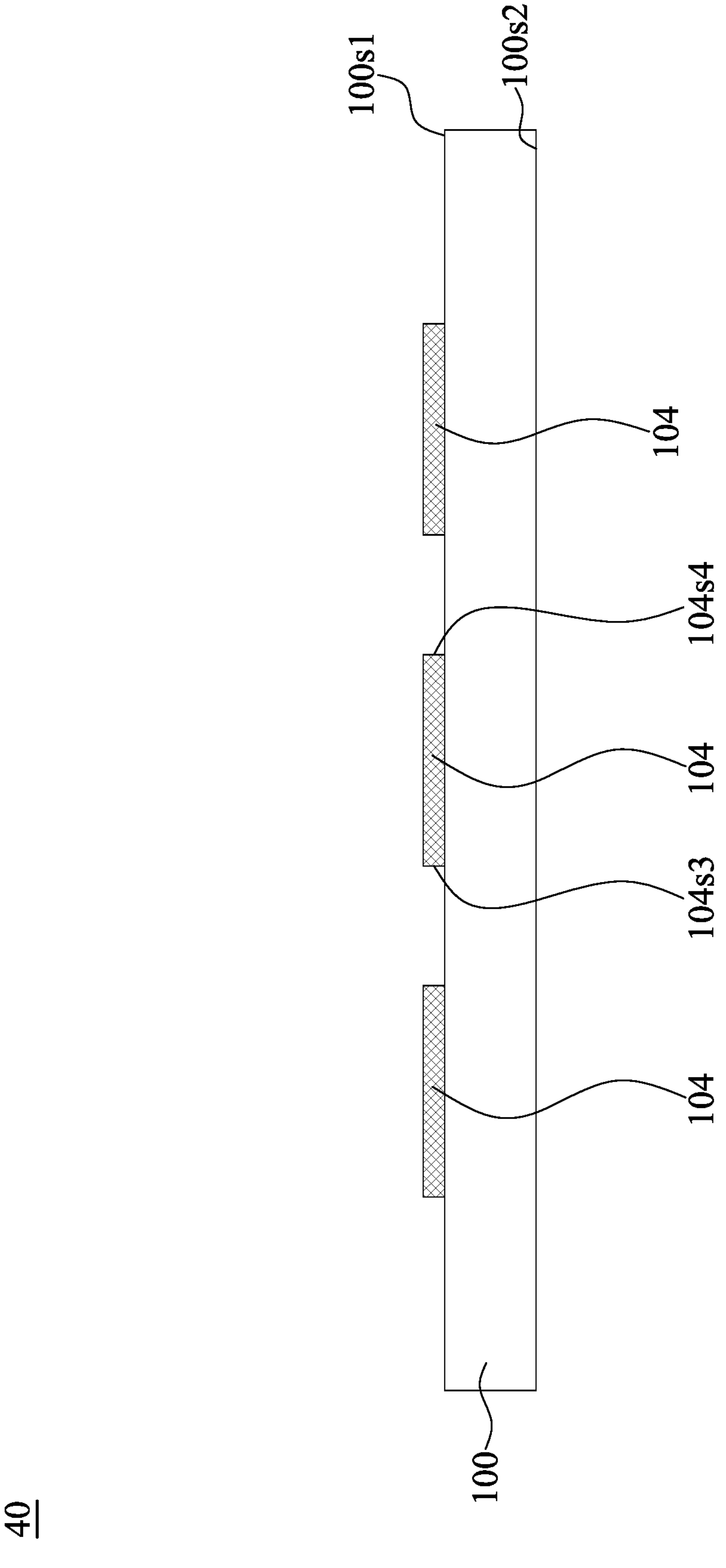

In FIG. 4B, the plurality of first electrodes 104 are disposed on the substrate 100. Each of first electrodes 104 is configured to be electrically connected to the substrate 100. Each of first electrodes 104 is in contact with the upper surface 101*s*1 of the substrate 100. An array pattern of the first electrodes 104 is designed in consideration of an arrangement of pixels.

Figure 4C:
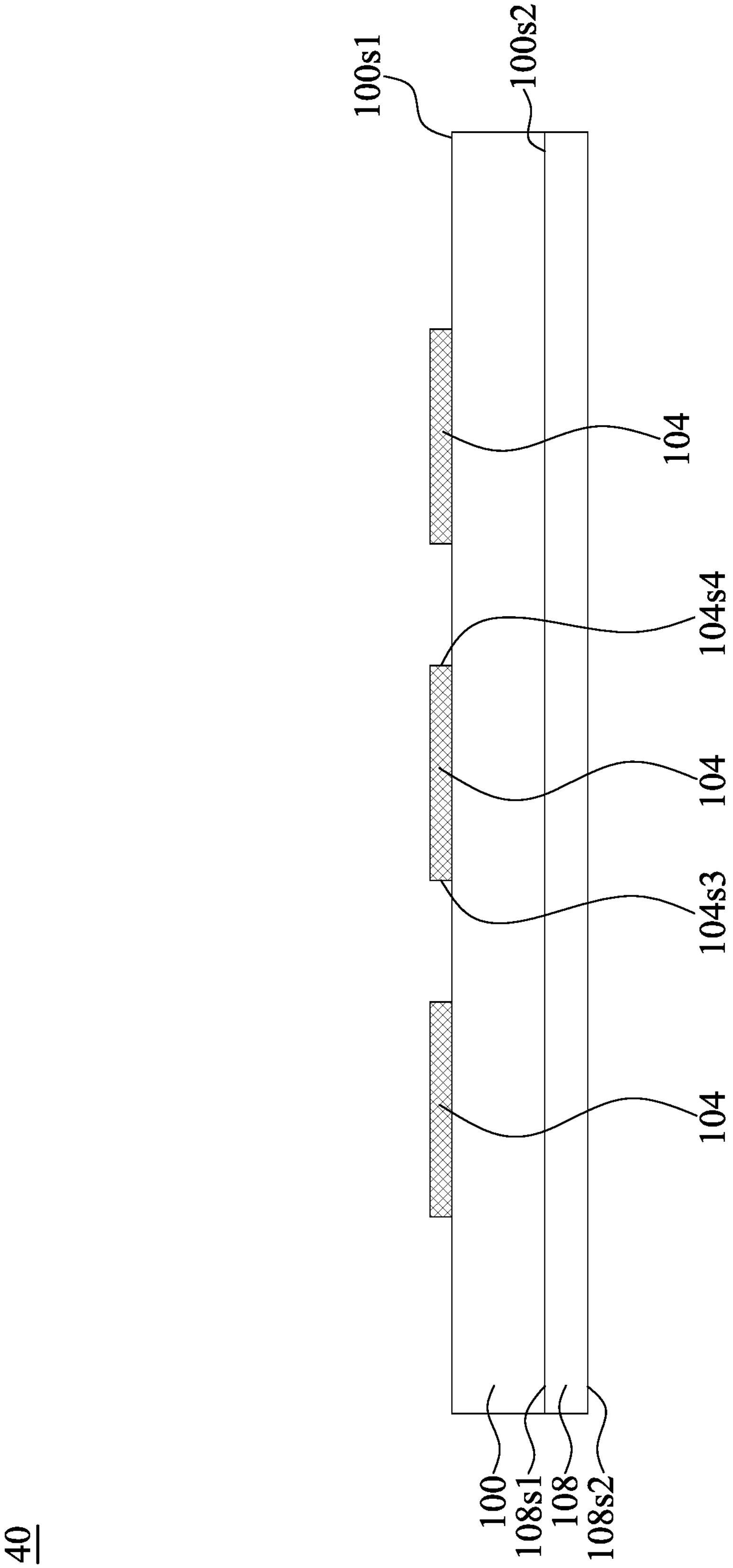

In FIG. 4C, the anti-reflective layer 108 is disposed on the lower surface 100*s*2 of the substrate 100. The upper surface 108*s*1 of the anti-reflective layer 108 is in contact with the lower surface 100*s*2 of the substrate 100. The anti-reflective layer 108 can include, for example, calcium fluoride, magnesium fluoride, titanium oxide, lead sulfide, lead selenide, a vinyl silsesquioxane hybrid film, or a diamond film. In some embodiments, the anti-reflective layer 108 is plated on the lower surface 100*s*2 of the substrate 100. In some embodiments, the anti-reflective layer 108 can be formed by sputtering, chemical plating, evaporation or electroplating.

Figure 4D:
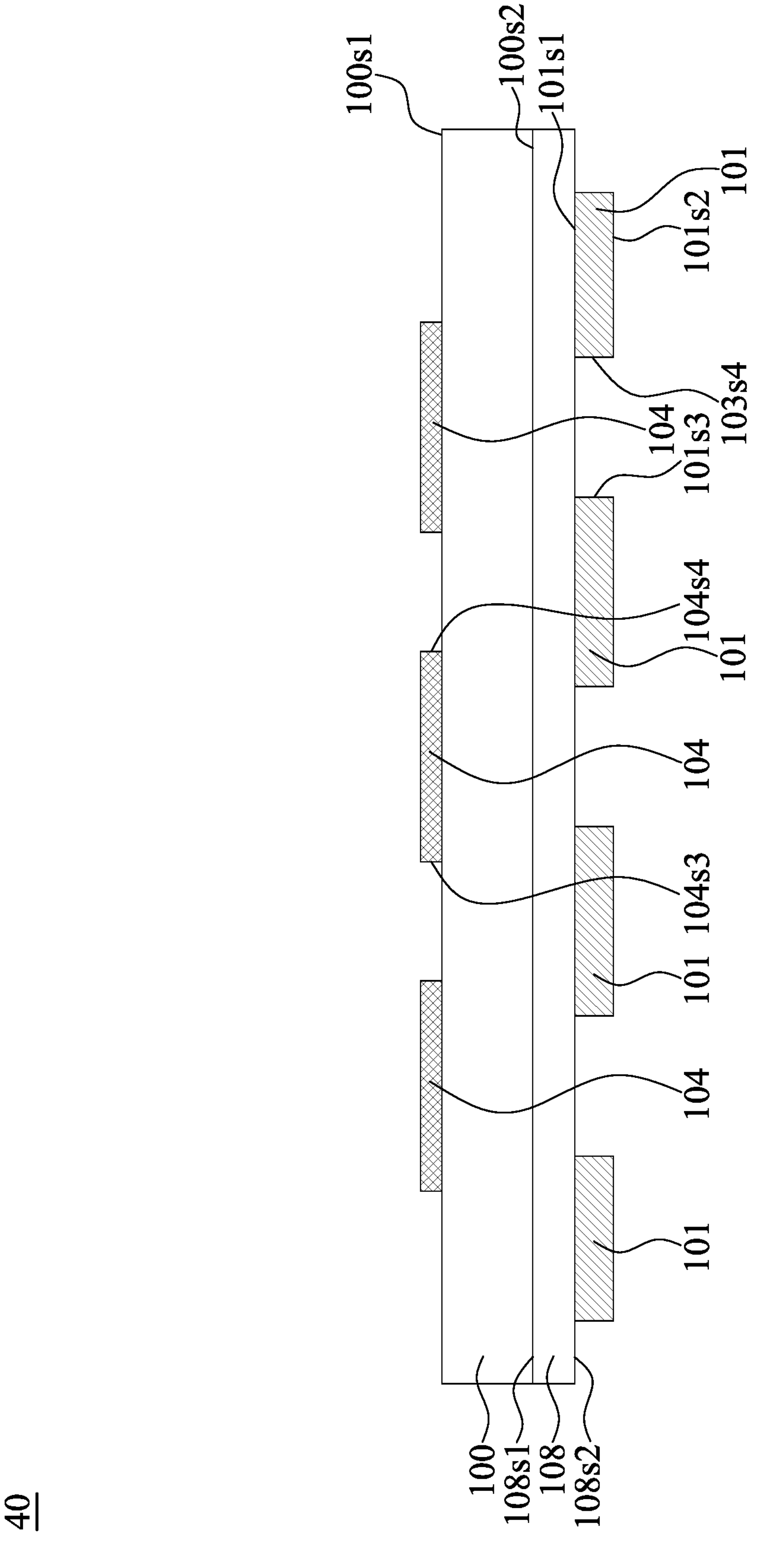

In FIG. 4D, the plurality of light blocking layers 101 are disposed on the lower surface 108*s*2 of the anti-reflective layer 108. Each of light blocking layers 101 is configured to be formed on the same side of the anti-reflective layer 108. Each of light blocking layers 101 is in contact with the lower surface 108*s*21 of the anti-reflective layer 108. The light blocking layers 101 are separated from one another.

Figure 4E:
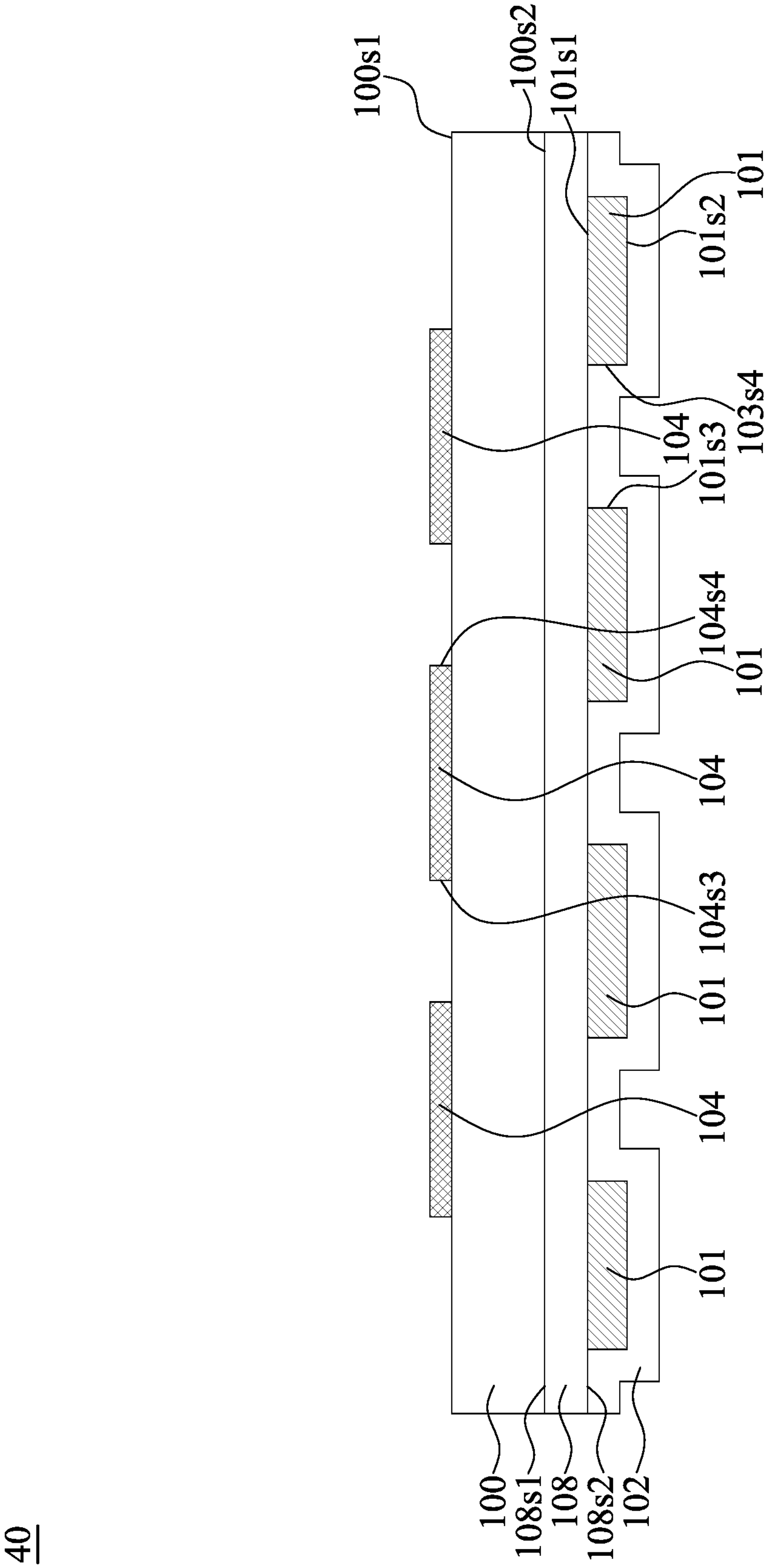

In FIG. 4E, the cover layer 102 is disposed on each of the light blocking layers 101. The cover layer 102 covers the lower surface 101*s*2 and the two side surfaces 101*s*3 and 101*s*4 of each of the plurality of light blocking layers 101. The cover layer 102 is in contact with the anti-reflective layer 108. The cover layer 102 is formed above the plurality of light blocking layers 101 by one of chemical vapor deposition (CVD), physical vapor deposition (PVD) and spin coating (SOG).

Figure 4F:
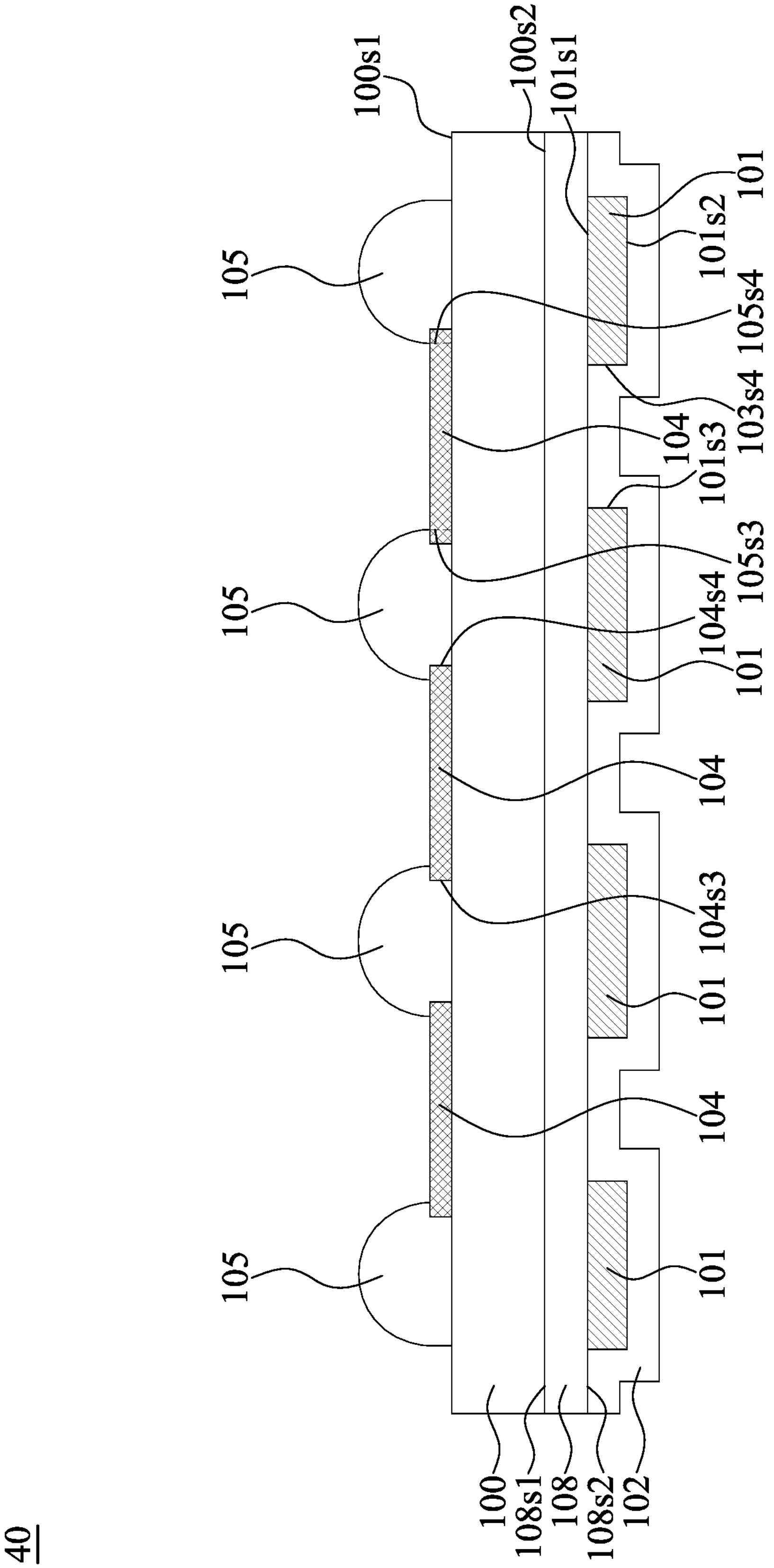

In FIG. 4F, the plurality of protrusions 105 are disposed on the substrate 100. Each of the protrusions 105 is formed on a portion of an upper surface of the first electrode 104 and envelops a side surface of the first electrode 104. The protrusion 105 partially covers each of the first electrodes 104. The protrusions 105 can be formed to have different shapes. In some embodiments, the protrusion 105 has a curved surface. In some embodiments, the protrusion 105 has a trapezoidal shape. After the protrusion 105 is formed, a cleaning operation is performed to clean the protrusion 105 and the exposed surface of the first electrode 104. In some embodiments, during the cleaning operation, ionized water is heated to a temperature between 30° C. and 80° C. Once the temperature of the ionized water is heated to a predetermined temperature, the ionized water is guided to the protrusion 105 and the exposed surface of the first electrode 104.

In some embodiments, ultrasonic waves are used during the cleaning process. Ultrasonic waves are introduced into a cleaning agent (for example, water or isopropyl alcohol (IPA). In some embodiments, carbon dioxide is introduced into the cleaning agent. After the cleaning operation, the cleaning agent is removed from the exposed surface by a heating operation. During the heating operation, the substrate 100 and the protrusion 105 can be heated to a temperature between 80° C. and 150° C. In some examples, compressed air is guided to the exposed surface, so as to help removing residuals of the cleaning agent while heating. After the heating operation, O2, N2 or Ar plasma can be used to process the exposed surface. The plasma is used to roughen the exposed surface. In some embodiments, ozone is used to adjust conditions of the exposed surface.

Figure 4G:
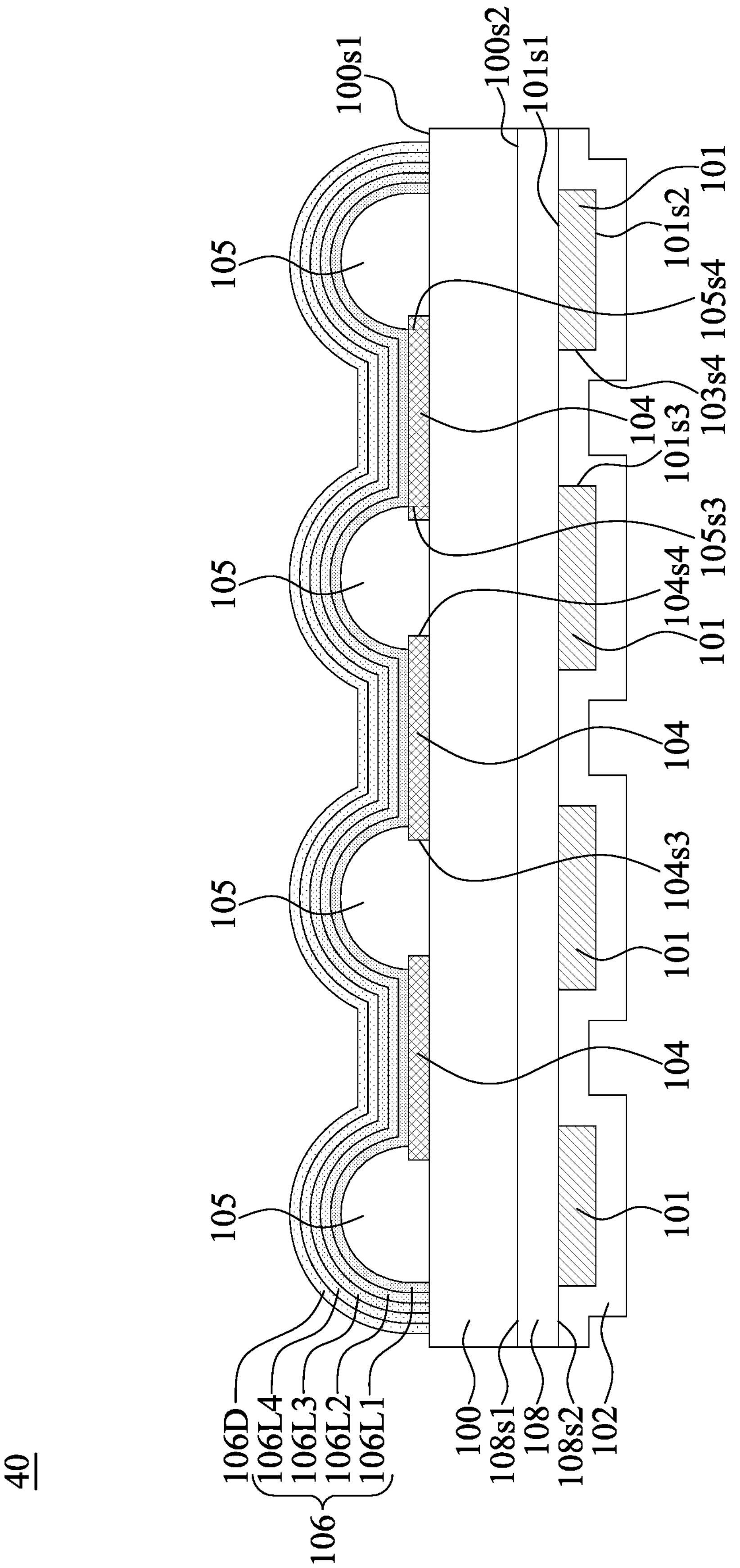

As shown in FIG. 4G, the carrier injection layer 106L1 is disposed on the protrusion 105, a portion of an exposed surface of the cover layer 102, and the exposed surface of the first electrode 104. The carrier injection layer 106L1 lines continuously along the exposed surface. More specifically, the exposed surface of each of the first electrodes 104 is configured to serve as an effective light emitting area of a light emitting unit (that is, a pixel). In some embodiments, all of the light emitting units use the carrier injection layer 106L1. In some embodiments, the carrier injection layer 106L1 is used for hole injection. In some embodiments, the carrier injection layer 106L1 is used for electron injection. The carrier injection layer 106L1 continuously covers the plurality of protrusions 105 and the exposed surface of the first electrode 104. Optionally, the carrier injection layer 106L1 is in contact with the protrusion 105. In some embodiments, the carrier injection layer 106L1 is in contact with the first electrode 104. In some embodiments, the carrier injection layer 106L1 is organic.

The carrier transport layer 106L2 is disposed on the protrusion 105, a portion of an exposed surface of the cover layer 102, and the exposed surface of the first electrode 104. The carrier injection layer 106L1 is disposed below the carrier transport layer 106L2. The carrier transport layer 106L2 is lined continuously along the carrier injection layer 106L1. In some embodiments, all of the light emitting units use the carrier transport layer 106L2. In some embodiments, the carrier transport layer 106L2 is used for hole injection. In some embodiments, the carrier transport layer 106L2 is used for electron injection. The carrier transport layer 106L2 continuously covers the plurality of protrusions 105 and the first electrode 104. Optionally, the carrier transport layer 106L2 is in contact with the carrier injection layer 106L1. In some embodiments, the carrier transport layer 106L2 is organic. The organic emissive layer 106L3 is disposed on the protrusion 105, a portion of the exposed surface of the cover layer 102, and the exposed surface of the first electrode 104. The organic emissive layer 106L3 covers the carrier transport layer 106L2. The organic emissive layer 106L3 completely covers the exposed carrier transport layer 106L2. The organic emissive layer 106L3 is configured to emit a first color.

As shown in FIG. 4G, the organic carrier transport layer 106L4 is disposed on the organic emissive layer 106L3. The organic carrier transport layer 106L4 can be a hole or electron transport layer. In some embodiments, the organic carrier transport layer 106L4 and the carrier transport layer 160L2 are each configured in opposite valence states. In some embodiments, the second electrode 106D is disposed on the organic carrier transport layer 106L4. The second electrode 160D covers the organic carrier transport layer 106L4. The second electrode 160D can be a metal material, for example, Ag or Mg. In some embodiments, the second electrode 160D includes ITO or IZO. In some embodiments, when observing from a section diagram, each of the light emitting units (that is, each pixel) has an independent second electrode 106D.

The operations in FIG. 4A and FIG. 4G can be repeatedly performed so as to form light emitting units of different colors.

Figure 5B:
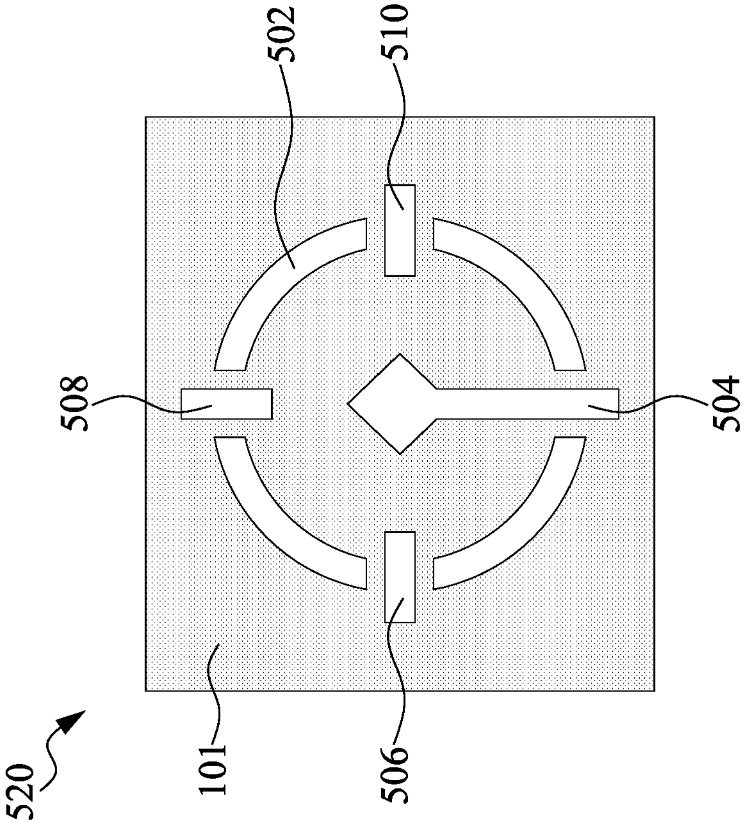
FIG. 5A and FIG. 5B are plan views of a light blocking layer according to an embodiment.
Figure 5A:
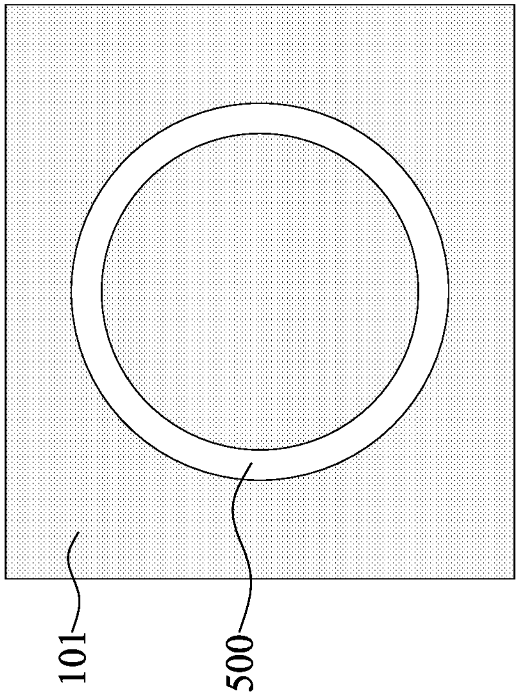

Referring to FIG. 5A, in some embodiments, the light blocking layer 101 can have a recess 500 (which can correspond to the part W1 shown in FIG. 3) exhibiting an arc profile from a perspective of a plan view. The recess 500 can also be referred to as an opening. The recess 500 allows transmission of light emitted by a light emitting unit (for example, 30*a*, 30*b* or 30*c*). In some embodiments, the recess 500 allows transmission of light emitted by one single light emitting unit. In some embodiments, the recess 500 allows transmission of light emitted by a plurality of light emitting units.

Referring to FIG. 5B, in some embodiments, the light blocking layer 101 can include first recesses 502 and second recesses 504, 506, 508 and 510. The first recesses 502 have arc profiles. The second recess 504 has an arrow-shaped profile. The second recesses 506, 508 and 510 have rectangular profiles. The first recesses 502 and the second recesses 504, 506, 508 and 510 are in a staggered arrangement so as to jointly form a bullseye pattern (for example, the pattern 120 shown in FIG. 1).

The bullseye pattern allows transmission of light emitted by a light emitting unit (for example, 30*a*, 30*b* or 30*c*). In some embodiments, the first recesses 502 can overlap an effective light emitting area of a single light emitting unit, so as to allow transmission of light emitted by the single light emitting unit. In some embodiments, the first recesses 502 can overlap an effective light emitting areas of a plurality of light emitting units, so as to allow transmission of light emitted by the plurality of light emitting units. In some embodiments, each of the second recesses 504, 506, 508 and 510 can overlap an effective light emitting area of a single light emitting unit, so as to each allow transmission of light emitted by the single light emitting unit. In some embodiments, each of the second recesses 504, 506, 508 and 510 can overlap an effective light emitting area of a plurality of light emitting units, so as to each allow transmission of light emitted by the plurality of light emitting units.

In some embodiments, the first recesses 502 and the second recesses 504, 506, 508 and 510 can overlap an effective light emitting area of a single light emitting unit, so as to allow transmission of light emitted by the single light emitting unit. In some embodiments, the first recesses 502 and the second recesses 504, 506, 508 and 510 can overlap effective light emitting areas of a plurality of light emitting units, so as to allow transmission of light emitted by the plurality of light emitting units.

The present application can adjust the pattern into a desired shape according to actual requirements.

Figure 6:
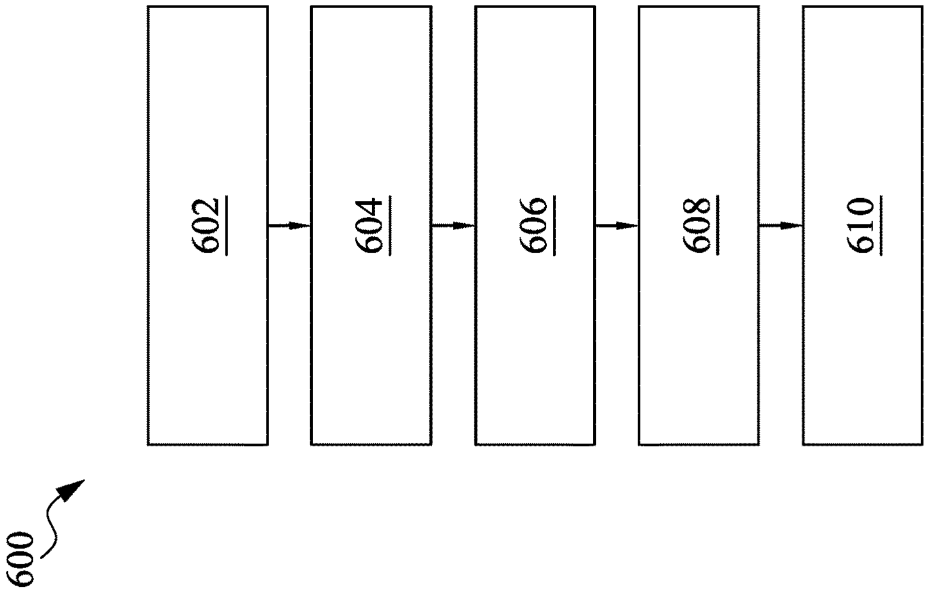
FIG. 6 is a flowchart of manufacturing of a light emitting element according to an embodiment.

FIG. 6 shows a flowchart 600 of manufacturing of a light emitting element according to an embodiment. In step 602, the first electrode 104 is plated on the upper surface of the substrate 100. In step 604, the anti-reflective layer 108 is plated on the lower surface of the substrate 100. In some embodiments, the order for performing step 602 and step 604 can be modified. In step 606, the plurality of light blocking layers 101 are disposed on the lower surface of the anti-reflective layer 108 and a plurality of openings are included. In step 608, the cover layer 102 is coated so as to cover the plurality of light blocking layers 101. In step 610, the plurality protrusions 105 and the organic light emitting stack layer 106 are formed on the substrate 100.

The features of some embodiments are given in brief in the description above for a person skilled in the art to better understand various aspects of the present disclosure. A person skilled in the art would be able to understand that the present disclosure can be used as the basis for designing or modifying other manufacturing processes and structures so as to achieve the same objects and/or the same advantages of the embodiments described in the present application. A person skilled in the art would also be able to understand that such structures do not depart from the spirit and scope of the disclosure of the present application, and various changes, substitutions and replacements may be made by a person skilled in the art without departing from the spirit and scope of the present disclosure.

What is claimed is:

1. A light emitting element, comprising:

a substrate;

an anti-reflective layer, in contact with a first surface of the substrate;

a plurality of light blocking layers, in contact with a first surface of the anti-reflective layer;

a cover layer, in contact with the first surface of the anti-reflective layer, and covering the plurality of light blocking layers;

a conductive layer, in contact with a second surface of the substrate, wherein the second surface is in parallel and opposite to the first surface; and a plurality of protrusions, disposed on the second surface of the substrate and covering a portion of the conductive layer, wherein two adjacent protrusions of the plurality of protrusions have an organic light emitting element including an organic material in between.

2. The light emitting element according to claim 1, wherein an average reflectance of the anti-reflective layer is smaller than a first value, a reflectance of the anti-reflective layer with respect to a predetermined wavelength is smaller than a second value, and the first value is smaller than the second value.

3. The light emitting element according to claim 2, wherein the predetermined wavelength comprises a wavelength of visible light.

4. The light emitting element according to claim 1, wherein the anti-reflective layer absorbs light emitted by the organic light emitting unit and reflected by the conductive layer.

5. The light emitting element according to claim 1, wherein a distance between each edge of the two adjacent protrusions of the organic light emitting unit is greater than a distance between each edge of the two adjacent light blocking layers of the plurality of light blocking layers.

6. The light emitting element according to claim 1, wherein the conductive layer comprises an anode.

7. The light emitting element according to claim 1, wherein one of the plurality of protrusions has an edge which is offset from an edge of one of the plurality of light blocking layers in a vertical direction.

8. A light emitting element, comprising:

a substrate;

an anti-reflective layer, located below the substrate;

a patterning light blocking layer, located below the anti-reflective layer and having an opening;

a cover layer, located below the patterning light blocking layer;

a plurality of protrusions, disposed on the substrate, wherein two adjacent protrusions of the plurality of protrusions have an organic light emitting element including an organic material in between, and the organic light emitting unit comprises a first light emitting unit, a second light emitting unit and a third light emitting unit.

9. The light emitting element according to claim 8, wherein the anti-reflective layer is in direct contact with the substrate and the patterning light blocking layer.

10. The light emitting element according to claim 8, wherein the anti-reflective layer absorbs light emitted by the organic light emitting unit and reflected by the conductive layer.

11. The light emitting element according to claim 8, wherein an average reflectance of the anti-reflective layer is smaller than a first value, a reflectance of the anti-reflective layer with respect to a wavelength of visible light is smaller than a second value, and the first value is smaller than the second value.

12. The light emitting element according to claim 11, wherein the first value is smaller than 0.6%, and the second value is smaller than 1%.

13. The light emitting element according to claim 8, wherein the organic light emitting unit comprises a first light emitting unit, a second light emitting unit and a third light emitting unit, each of which having an effective light emitting region with a size defined by an anode located below each of the light emitting units.

* * * * *